(12) United States Patent
Zhu et al.

(10) Patent No.: US 7,358,169 B2
(45) Date of Patent: Apr. 15, 2008

(54) LASER-ASSISTED DEPOSITION

(75) Inventors: Lei Zhu, Singapore (SG); Seng Teng Khor, Singapore (SG); Qiong Chen, Singapore (SG); Cary G. Addington, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 351 days.

(21) Appl. No.: 11/105,262

(22) Filed: Apr. 13, 2005

(65) Prior Publication Data
US 2006/0234163 A1   Oct. 19, 2006

(51) Int. Cl.
*H01L 21/31* (2006.01)
(52) U.S. Cl. ............... 438/584; 438/676; 430/311; 257/E21.582
(58) Field of Classification Search ......... 438/584, 438/676; 427/596, 597
See application file for complete search history.

(56) References Cited

U.S. PATENT DOCUMENTS

| | | | |
|---|---|---|---|
| 4,334,139 A * | 6/1982 | Wittekoek et al. | 219/121.3 |
| 6,177,151 B1 * | 1/2001 | Chrisey et al. | 427/596 |
| 6,472,030 B1 * | 10/2002 | Balkus, Jr. et al. | 427/597 |
| 2006/0044702 A1 * | 3/2006 | Ding et al. | 360/323 |

\* cited by examiner

*Primary Examiner*—Alexander Ghyka

(57) ABSTRACT

A method is provided for depositing a patterning material onto an optically transparent substrate by the use of a laser beam. A solid layer of a patterning material is placed adjacent to a receiving surface of the substrate. A laser beam is directed at an incident angle between 0 and 90° relative to the receiving surface. The laser beam is transmitted through the substrate and onto the solid layer to cause patterning material from the solid layer to deposit onto the receiving surface of the substrate.

12 Claims, 2 Drawing Sheets

LASER-ASSISTED DEPOSITION

BACKGROUND

Recently, laser induced forward transfer (LIFT) has been used for forming small metal features in the fabrication of electronic devices. With LIFT, a desired metal pattern may be directly written on a target substrate without a photolithography process. This process is also called metal scribing or direct writing. Typically, LIFT involves placing a transparent support substrate having a thin metal film formed thereon in close proximity to a target substrate. The transparent substrate and the target substrate are mounted in a sealed vacuum chamber. A laser source directs a laser beam through the transparent support substrate to ablate the thin metal film along a desired pattern. The metal is then evaporated from the thin metal film onto the target substrate in a desired pattern. One shortcoming of the LIFT process is that the deposited trace thickness is less than 1 μm and has relatively low conductivity. Thus, only very small amount of material can be deposited onto the target substrate. Another shortcoming is that the width of the deposited trace is larger than the laser beam size.

There exists a need for a deposition method that is capable of producing relatively thick metal pattern with narrow line width.

SUMMARY

The present invention provides a method for depositing a patterning material onto an optically transparent substrate by the use of a laser beam. A solid layer of a patterning material is placed adjacent to a receiving surface of the substrate. A laser beam is directed at an incident angle between 0 and 90° relative to the receiving surface. The laser beam is transmitted through the substrate and onto the solid layer to cause patterning material from the solid layer to deposit onto the receiving surface of the substrate.

The objects, aspects and advantages of the present invention will become apparent from the following detailed description, taken in conjunction with accompanying drawings.

DETAILED DESCRIPTION

Figure 1:
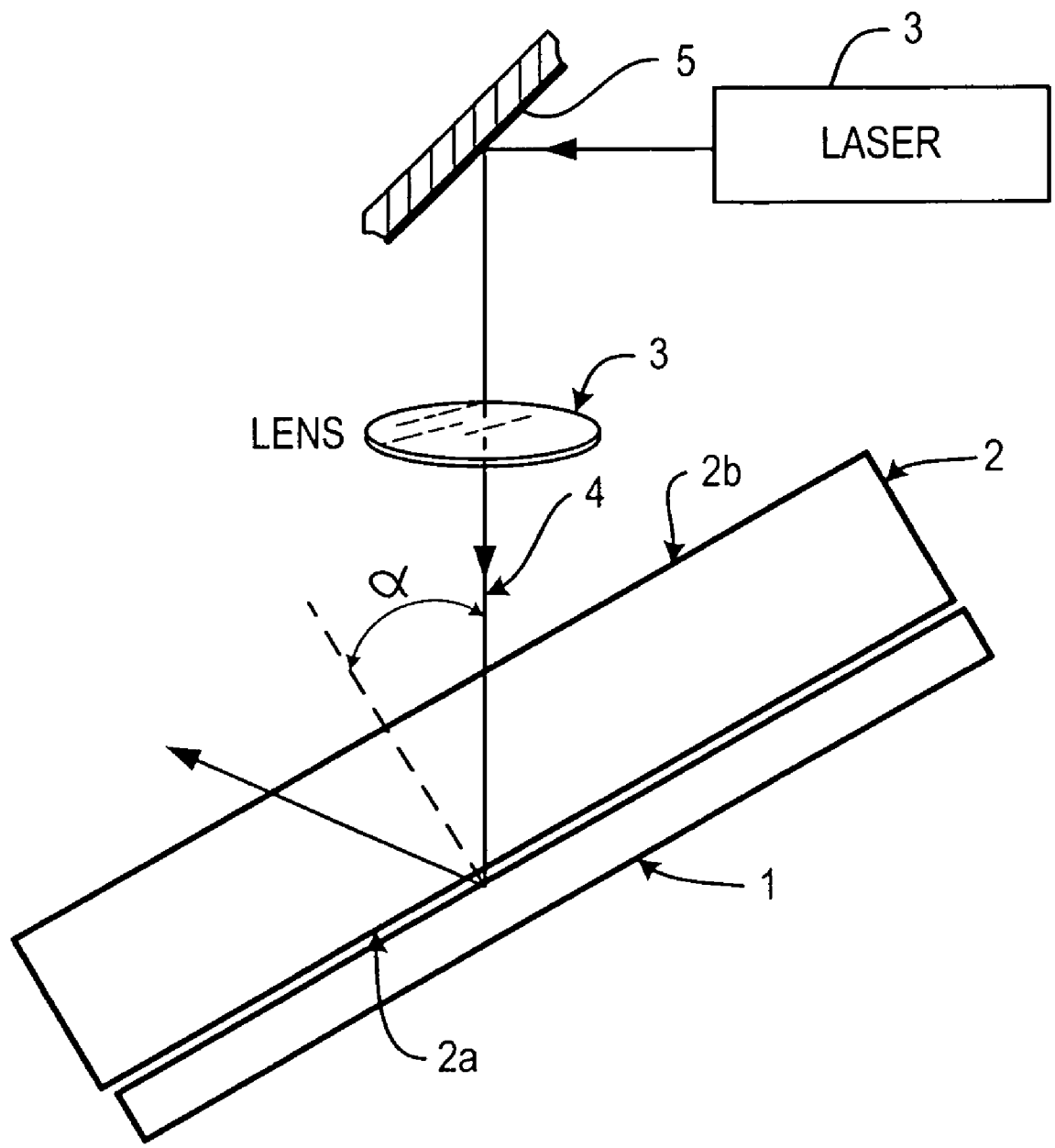
FIG. 1 schematically illustrates a setup for laser-assisted deposition according to an embodiment of the present invention.

The present invention provides a laser-assisted deposition method that generally does not require a vacuum environment. One feature of the present invention is the deposition of a patterning material directly from a solid layer, such as a foil or a free-standing sheet. A supporting substrate for the solid layer, in the present invention, is generally optional. In one embodiment of the present invention, as illustrated schematically in FIG. 1, a solid layer 1 of patterning material is positioned substantially adjacent to a receiving surface 2a of an optically transparent substrate 2. A laser beam 4 emitted from a laser source 3 is directed to the back surface 2b of the optically transparent substrate 2 at an incident angle α between 0 and 90°. A dichroic mirror 5 for shaping the beam path and a lens 6 for focusing the beam are positioned between the laser source 3 and the substrate 2. The focused beam 4 is transmitted through the substrate 2 from the back surface 2b and impinged upon the solid layer 1 to cause some patterning material from the solid layer 1 to deposit onto the receiving surface 2a of substrate 2. This laser-assisted deposition method may be carried out at or below ambient atmosphere.

Optically transparent is defined herein as being at least 50% transmissive to the applied laser wavelength. By way of example, a suitable optically transparent material for the substrate 2 includes glass, quartz or polymers, such as polyimide. The solid layer 1 may be in the form of a sheet or foil without any supporting substrate, and may be placed at a small separation distance from or in contact with the substrate 2. Furthermore, the solid layer 1 may be in single crystalline, polycrystalline or amorphous form. In one embodiment the solid layer 1 is made of a metallic material such as gold, silver, copper, indium, other refractory metals, and alloys thereof. In another embodiment, the solid layer 1 is made of carbon. The thickness of the solid layer 1 may vary depending on the desired thickness for the deposited film.

In one embodiment, the laser source 3 is a pulsed laser, e.g. excimer laser or Nd:YAG laser. In the situation where the solid layer 1 is spaced from the substrate 2, the threshold of radiation intensity (fluence per pulse) must transmit energy above threshold to the solid layer 1 to evaporate and transfer material from the solid layer 1 onto the substrate 2. In the situation where the solid layer 1 is in contact with the substrate 2, the evaporation process also dominates because the laser ablation creates a shallow groove in the solid layer 1. By moving the laser beam 4 relative to the substrate 2, a patterned film can be formed on the receiving surface 2a. By subjecting the solid layer 1 to successive laser pulses, a patterned film having a thickness of 20 μm or more could be achieved. The laser beam not only evaporates material from the solid layer 1 but also simultaneously removes the deposited material formed on substrate 2 where laser beam passes through the substrate in a similar way as the conventional LIFT. This is because the laser fluences within the field depth of the laser focusing lens are comparable at both the solid layer 1 and deposited material on surface 2a. As a consequence, the line width of the deposited film is determined by the following relationship, instead of laser beam spot size:

$$w = h \times \tan \alpha$$

where w is the line width of deposited film, α is the incident angle of laser beam 4 with respect to substrate 2, h is the gap between solid layer 1 and the receiving surface 2a of substrate 2, i.e., the distance from the ablated position to substrate 2. When solid layer 1 is in contact with substrate 2, h is the etch depth in the solid layer 1 that is caused by laser ablation. When there is a gap between solid layer 1 and substrate 2, h should be the sum of the gap width and the etch depth. As an example, the gap between the solid layer and the receiving surface may be varied between 0 and 10 mm.

Figure 2:
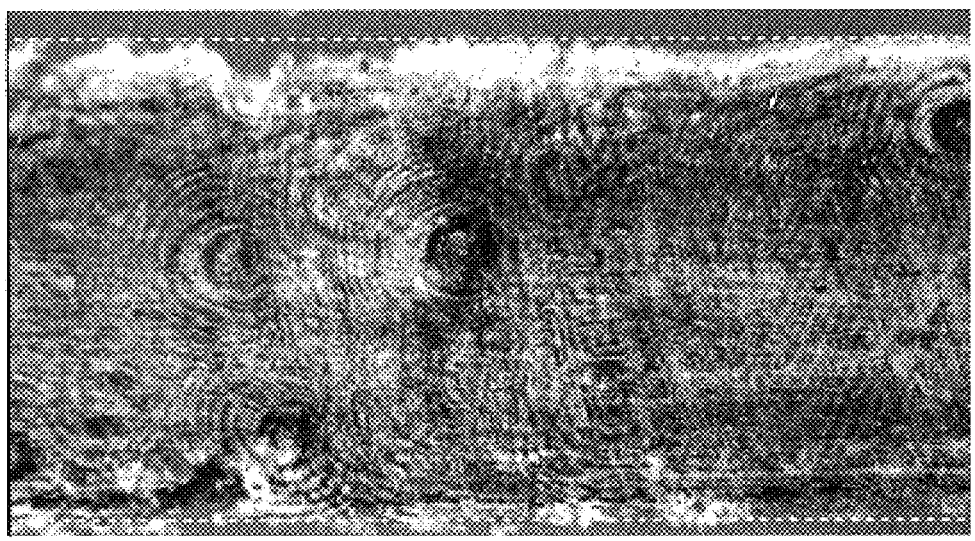
FIG. 2 is a photomicrograph of a gold trace produced according to the present invention.

FIG. 2 shows a gold trace having a line width of about 356 μm, which was produced according to the method described above.

Tests have been successively conducted for the following non-limiting example.

EXAMPLE

In an ambient atmosphere, an indium foil having a thickness of 100 μm was placed in contact with a quartz substrate having a thickness of 0.5 mm. A Nd:YAG laser having wavelength λ of 532 nm, laser energy of 0.8 mJ, and pulse duration of 8 ns, was used to transmit a pulsed laser beam through the quartz substrate. The laser beam was directed at an incident angle of 8.3° relative to the quartz substrate while moving the substrate and the indium foil together. A series of laser pulses were applied to each spot until an indium pattern having a thickness of 16 µm was formed on the quartz substrate. When the beam spot size was 50 µm, a line width of about 15 µm was achieved for the indium pattern at an incident angle of 8.3°. While a line width of 24 µm was achieved at an incident angle of 13.7°. The deposited indium film contains a minor amount of oxygen (about 24% or less) at its outer surface while substantially pure indium in the bulk. The resistivity of the deposited indium was found to be 13.3 µohms·cm, which is 1.7 times that of bulk value 8 µohms·cm. This resistivity indicates that the indium thin film has a very good conductivity.

The laser-assisted deposition method of the present invention has applicability in the fabrication of electronic devices, but is not limited thereto. For example, the deposition method of the present invention could be used to form circuit patterns on electronic devices. A conductive pattern deposited by this method could also serve as a seed layer for subsequent plating process.

It is intended that that the embodiments contained in the above description and shown in the accompanying drawings are illustrative and not limiting. It will be clear to those skilled in the art that modifications may be made to the embodiments without departing from the scope the invention as defined by the appended claims.

What is claimed is:

1. A method for depositing a patterning material onto an optically transparent substrate, wherein the optically transparent substrate includes a back surface and a receiving surface, said method comprising:
    placing a solid layer of patterning material substantially adjacent to the receiving surface of the substrate, wherein the solid layer includes a first surface facing the receiving surface and a second surface facing away from the receiving surface;
    directing a focused laser beam at an incident angle between 0 and 90° relative to the receiving surface and through the back surface; and
    depositing patterning material from the first surface of the solid layer onto the receiving surface of the optically transparent substrate by transmitting the laser beam through the optically transparent substrate onto the solid layer to cause the patterning material from the first surface of the solid layer to evaporate and become deposited onto the receiving surface.

2. The method of claim 1, wherein the patterning material comprises a metallic material.

3. The method of claim 1, wherein the patterning material comprises carbon.

4. The method of claim 1, wherein the patterning material is a semiconductor.

5. The method of claim 1, wherein the solid layer is placed at a distance from the receiving surface of the substrate.

6. The method of claim 5, wherein the distance between the solid layer and the receiving surface is between 0 and 10 mm.

7. The method of claim 1, wherein the solid layer is in contact with the receiving surface of the substrate.

8. The method of claim 1, wherein the substrate is moved relative to the focused laser beam so that the patterning material is deposited in a pattern on the receiving surface.

9. The method of claim 1, wherein the deposition of the patterning material is carried out at ambient atmosphere.

10. The method of claim 1, wherein the deposited patterning material has a line width that is smaller than the width of the focused laser beam.

11. The method of claim 1, wherein the solid layer is a free-standing layer without a support.

12. The method of claim 1, wherein depositing the patterning material further comprises transmitting the laser beam through the optically transparent substrate to cause the second surface of the solid layer to remain intact as the first surface is evaporated.

* * * * *